(12) United States Patent
Kawamura et al.

(10) Patent No.: US 11,521,823 B2
(45) Date of Patent: Dec. 6, 2022

(54) SAMPLE ATTACHMENT DEVICE

(71) Applicant: JEOL Ltd., Tokyo (JP)

(72) Inventors: Takahisa Kawamura, Tokyo (JP); Hideaki Kimura, Tokyo (JP)

(73) Assignee: JEOL Ltd., Tokyo (JP)

( * ) Notice: Subject to any disclaimer, the term of this patent is extended or adjusted under 35 U.S.C. 154(b) by 330 days.

(21) Appl. No.: 17/032,122

(22) Filed: Sep. 25, 2020

(65) Prior Publication Data
US 2021/0098225 A1    Apr. 1, 2021

(30) Foreign Application Priority Data

Sep. 30, 2019 (JP) .............................. JP2019-178678

(51) Int. Cl.
*H01J 37/20* (2006.01)
*H01J 37/16* (2006.01)
*H01J 37/18* (2006.01)

(52) U.S. Cl.
CPC .............. *H01J 37/20* (2013.01); *H01J 37/16* (2013.01); *H01J 37/18* (2013.01); *H01J 2237/2002* (2013.01)

(58) Field of Classification Search
CPC .. H01J 37/26; H01J 37/20; H01J 37/16; H01J 37/28; H01J 37/185; H01J 2237/20; H01J 2237/204; H01J 2237/2002; G01B 21/26; G01B 21/34
See application file for complete search history.

(56) References Cited

FOREIGN PATENT DOCUMENTS

JP            201877966 A     5/2018
KR         20030015231 A  *  2/2003

* cited by examiner

*Primary Examiner* — David E Smith
*Assistant Examiner* — Hsien C Tsai
(74) *Attorney, Agent, or Firm* — The Webb Law Firm

(57) ABSTRACT

A sample attachment device includes a mount, a mounted depression, and a pressure release depression. Liquid and air bubbles can pass the pressure release depression. The mounted depression is on the mount. A cartridge is mounted on the mounted depression. The pressure release depression is in the mounted depression. The pressure release depression is vertically under the cartridge when the cartridge is mounted on the mounted depression.

8 Claims, 9 Drawing Sheets

FIG. 10A
FIG. 10B
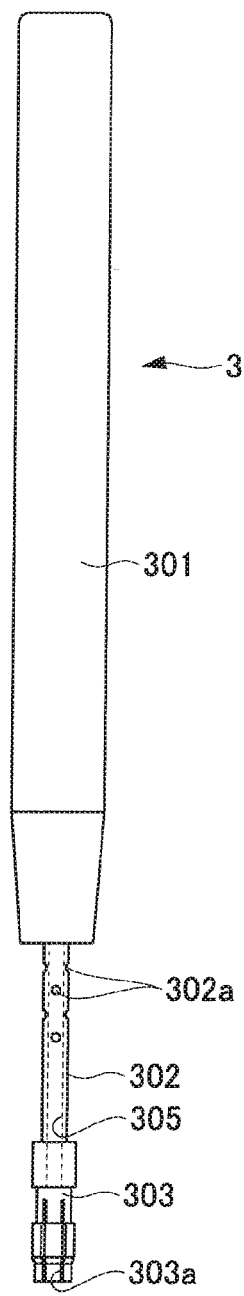
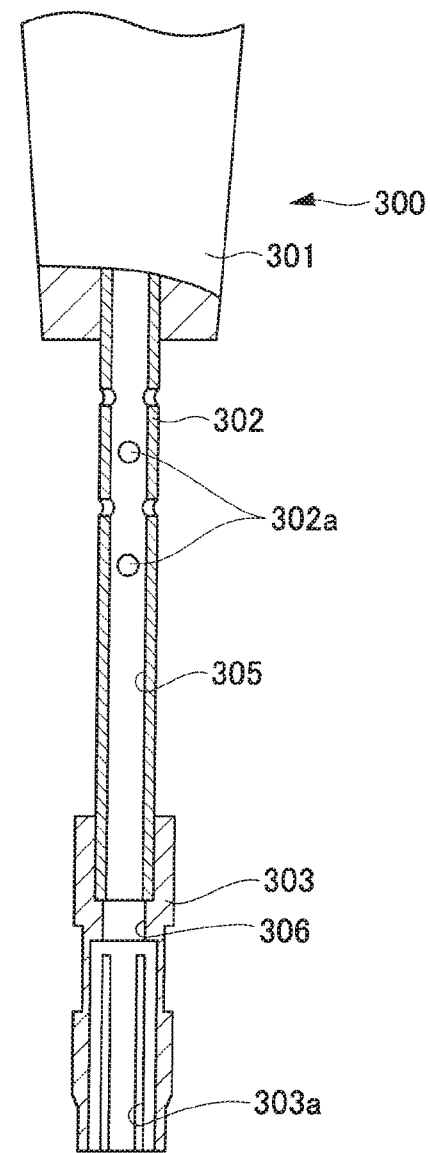

SAMPLE ATTACHMENT DEVICE

CROSS-REFERENCE TO RELATED APPLICATION

This application claims priority to Japanese Patent Application No. 2019-178678 filed Sep. 30, 2019, the disclosure of which is hereby incorporated by reference in its entirety.

BACKGROUND OF THE INVENTION

Field of the Invention

The present invention relates to a sample attachment device for setting a sample on a cartridge observed by, for example, a charged particle beam device and an electron microscope.

Description of Related Art

To use a sample observed by the charged particle beam device and the electron microscope, the sample is generally attached to a cartridge that has a shape like a flat plate. Further, the sample is attached to the cartridge through a holder that includes a C-ring that is elastic.

Further, a device that sets a sample on a cartridge is disclosed in, for example, JP 2018-77966 A. JP 2018-77966 A discloses a technique that includes a mount and a groove. The mount has an operation surface. On the operation surface, an operation of attaching a sample to a sample attachment portion of a cartridge can be performed. The groove is on the operation surface of the mount. The cartridge is slidably mounted in the groove.

Further, while the mount is disposed in a liquid, such as liquid nitrogen, an operation of setting the sample and a holder on the cartridge is performed.

However, the technique disclosed in JP 2018-77966 A may apply pressure to the sample from the liquid that exists between the cartridge and the groove when the sample and the holder are set on the cartridge. The sample may be damaged.

Considering the above problems, it is an object of the present invention to provide a sample attachment device that can prevent a sample from being damaged.

SUMMARY OF THE INVENTION

To solve the above problems and achieve an object of the present invention, a sample attachment device according to the present invention attaches a sample to a cartridge through a holder. The sample attachment device includes a mount, a mounted depression, and a pressure release depression. Liquid and air bubbles can pass the pressure release depression. The mount is contained in a liquid. The mounted depression is on the mount. A cartridge is mounted on the mounted depression. The pressure release depression is in the mounted depression. The pressure release depression is vertically under the cartridge when the cartridge is mounted on the mounted depression.

A sample attachment device according to the present invention can prevent a sample from being damaged.

BRIEF DESCRIPTION OF THE DRAWINGS

FIGS. 10A and 10B are drawings illustrating a C-ring pushing-out jig of the sample attachment device according to the first exemplary embodiment of the present invention; FIG. 10A is an elevation view; and FIG. 10B is an enlarged cross-section view illustrating a front end;

DESCRIPTION OF THE INVENTION

Figure 1:
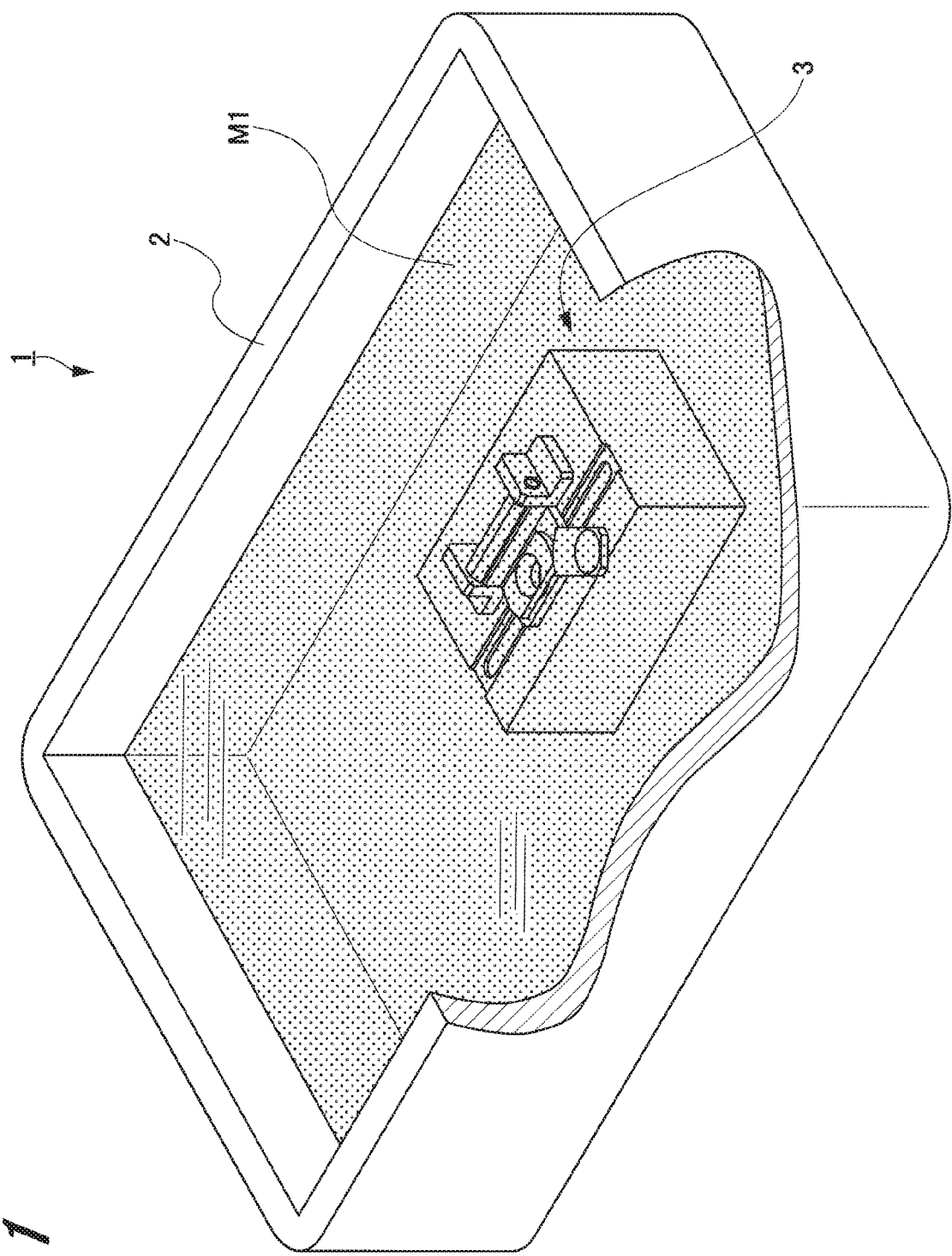
FIG. 1 is a schematic configuration view illustrating a sample attachment device according to a first exemplary embodiment of the present invention.

Hereinafter, sample attachment devices according to exemplary embodiments of the present invention will be described with reference to FIGS. 1 to 15. Note that common members in the drawings are marked with the same reference numerals. Further, the description will be given in the following order. However, the present invention is not necessarily limited to the following embodiments.

1. First Exemplary Embodiment 1-1. Configuration of Sample Attachment Device

First, a sample attachment device according to a first exemplary embodiment of the present invention (hereinafter referred to as the "present exemplary embodiment") will be described with reference to FIGS. 1 to 4.

FIG. 1 is a schematic configuration view illustrating the sample attachment device according to the present exemplary embodiment.

FIG. 1 illustrates the sample attachment device that sets a sample on a cartridge used for, for example, a cryogenic electron microscope. The cryogenic electron microscope freezes samples and observes the samples. As illustrated in FIG. 1, a sample attachment device 1 includes a container 2 and a sample attachment unit 3. The sample attachment device 1 also includes a preliminary-setting jig 200 (see FIG. 9) and a C-ring pushing-out jig 300 (see FIG. 10A).

The container 2 has a shape like a container that has an opening at a vertically top surface. The sample attachment unit 3 is disposed within the container 2. Liquid nitrogen M1, for example, is filled within the container 2. The container 2 contains an amount of the liquid nitrogen M1 that allows the whole sample attachment unit 3 that is disposed within the container 2 to be submerged by the liquid nitrogen M1. Note that an inner wall of the container 2 may have a mark that indicates the amount of the liquid nitrogen M1 that needs to be filled.

Further, an example in which the liquid nitrogen M1 is used as a liquid has been described. However, the liquid nitrogen M1 is not limitative but other various cooling liquids may be used.

Sample Attachment Unit

Next, the sample attachment unit 3 will be described with reference to FIGS. 2 to 4.

Figure 2:
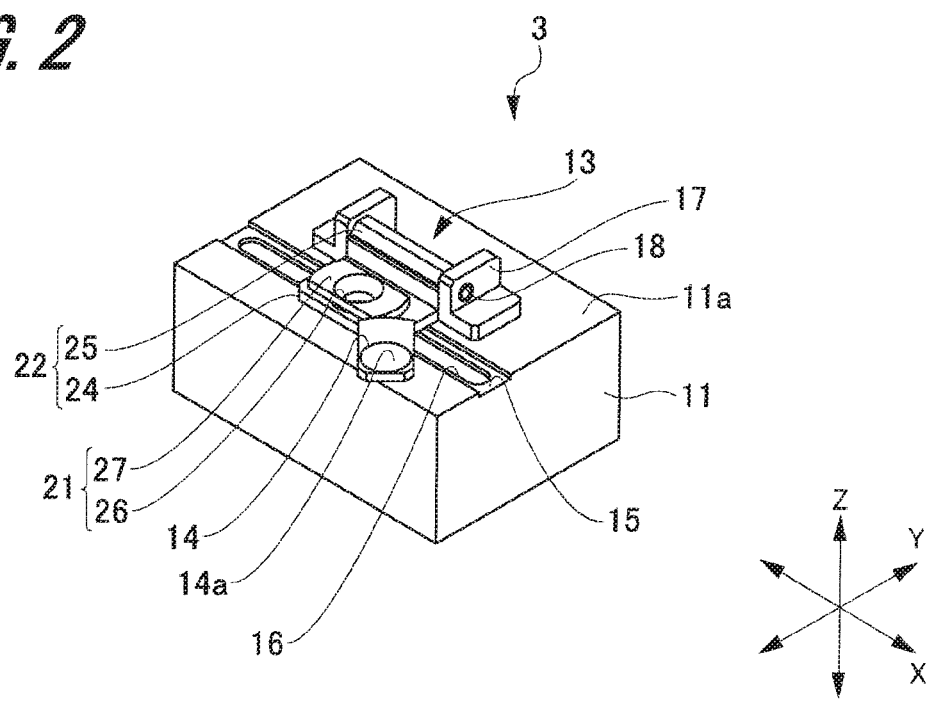
FIG. 2 is a perspective view illustrating a sample attachment unit of the sample attachment device according to the first exemplary embodiment of the present invention.

FIG. 2 is a perspective view illustrating the sample attachment unit 3. FIG. 3 is a top view illustrating the sample attachment unit 3. FIG. 4 is a cross-section view illustrating the sample attachment unit 3.

Figure 3:
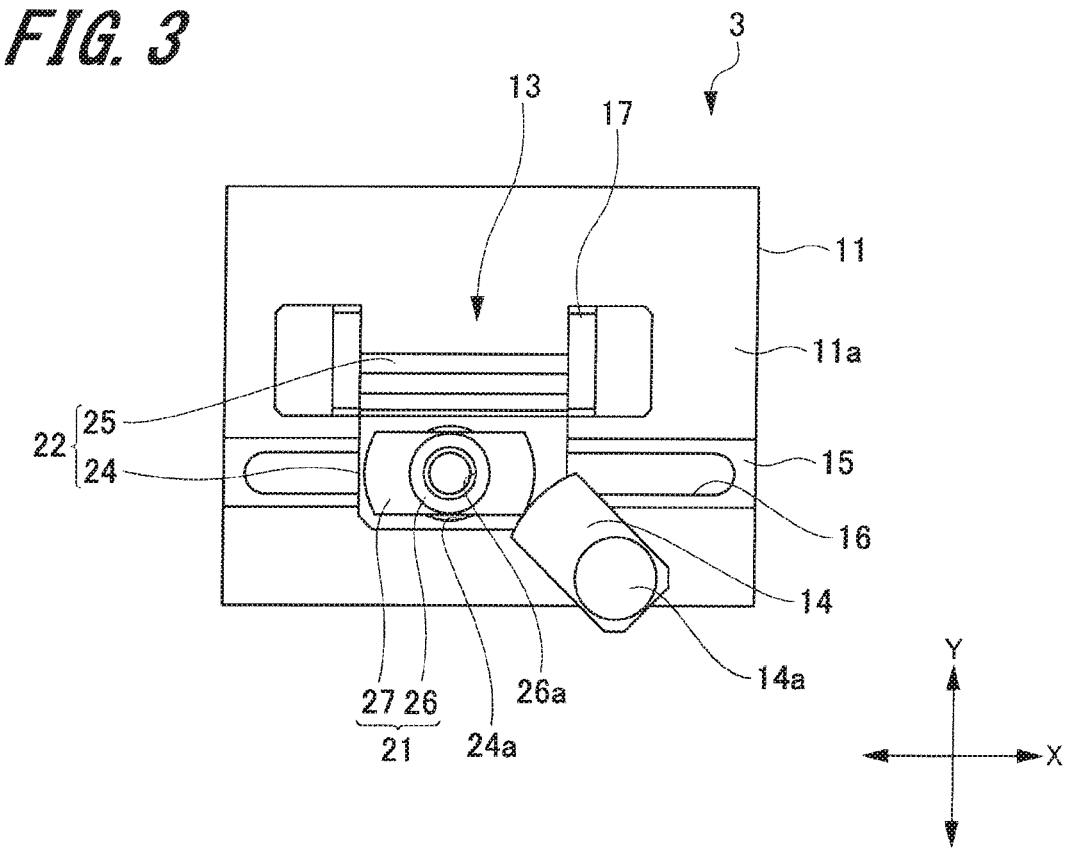
FIG. 3 is a top view illustrating the sample attachment unit of the sample attachment device according to the first exemplary embodiment of the present invention.
Figure 4:
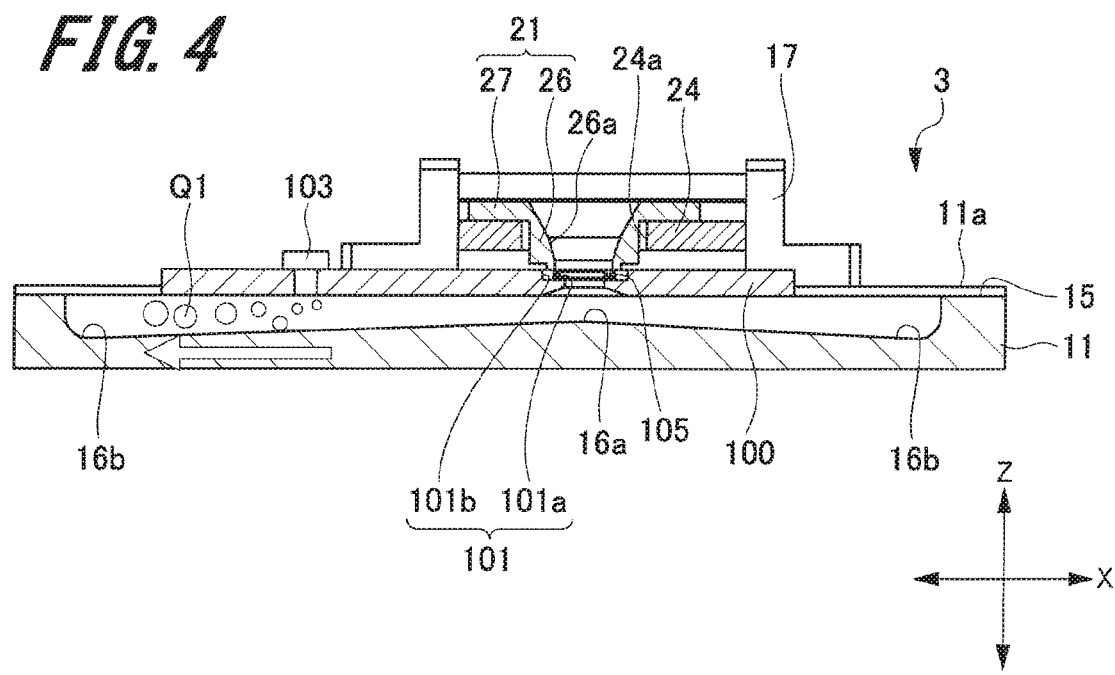
FIG. 4 is a cross-section view illustrating the sample attachment unit of the sample attachment device according to the first exemplary embodiment of the present invention.

As illustrated in FIGS. 2 and 3, the sample attachment unit 3 includes a mount 11, a C-ring guide member 13 that illustrates one example of a holder guide member, a guide holding portion 14, and two shaft supporting portions 17 and 17.

The mount 11 substantially has a shape like a cuboid. The mount 11 has an operation surface 11a on which an attachment operation is performed. The attachment operation attaches a sample S1 and a C-ring 105 (see FIG. 5). Hereinafter, a first direction X is parallel to a horizontal direction and is parallel to a long-side direction of the mount 11. A second direction Y is parallel to the horizontal direction and is parallel to a short-side direction of the mount 11. That is to say, the second direction Y is perpendicular to the first direction X. Further, a third direction Z is perpendicular to the first direction X and the second direction Y. That is to say, the third direction Z is perpendicular to the horizontal direction.

The mount 11 has a top surface on one side of the third direction Z. The top surface has the operation surface 11a. The operation surface 11a has a mounted depression 15. The mounted depression 15 extends from one end of the operation surface 11a to the other end of the operation surface 11a in the first direction X. The mounted depression 15 is a depression in the operation surface 11a. The mounted depression 15 is depressed toward the other side of the third direction Z. A cartridge 100 is slidably disposed in the mounted depression 15.

The C-ring guide member 13 and the guide holding portion 14 are provided for the operation surface 11a. The shaft supporting portions 17 and 17 are also provided for the operation surface 11a. The C-ring guide member 13, the guide holding portion 14, and the shaft supporting portions 17 and 17 are arranged near the mounted depression 15. The C-ring guide member 13 and the shaft supporting portions 17 and 17 are closer to one side of the second direction Y than the mounted depression 15 is. The guide holding portion 14 is closer to the other side of the second direction Y than the mounted depression 15 is.

The two shaft supporting portions 17 and 17 are arranged apart from each other in a direction in which the mounted depression 15 extends, that is to say in the first direction X. A rotation shaft 18 is disposed through the shaft supporting portions 17 and 17. The rotation shaft 18 is disposed in such a manner that an axial direction of the rotation shaft 18 is parallel to the first direction X. The C-ring guide member 13 is rotatably supported on the rotation shaft 18.

The C-ring guide member 13 includes a guide member 21 and a supporting member 22. The supporting member 22 has a rotation piece 24 that has a shape like a tongue, and a shaft receiving portion 25. The shaft receiving portion 25 is rotatably supported on the rotation shaft 18. The rotation piece 24 protrudes from the shaft receiving portion 25. If the shaft receiving portion 25 rotates on the rotation shaft 18, the rotation piece 24 is opposite the mounted depression 15 in the third direction Z, and a gap is between the rotation piece 24 and the mounted depression 15.

The rotation piece 24 has a through hole 24a (see FIG. 3). The guide member 21 is inserted in the through hole 24a (see FIG. 4).

The guide member 21 has a guide tube 26 that is substantially cylindrical, and a flange 27. A tube hole 26a of the guide tube 26 is tapered to make an inner diameter of the tube hole 26a continuously become smaller from one end to the other end in an axial direction. The C-ring 105, the preliminary-setting jig 200, and the C-ring pushing-out jig 300 are inserted in the tube hole 26a. The preliminary-setting jig 200 and the C-ring pushing-out jig 300 will be described below.

The guide tube 26 is inserted in the through hole 24a of the rotation piece 24. Further, an outer diameter of the guide tube 26 is smaller than a diameter of the through hole 24a. When the guide tube 26 is inserted in the through hole 24a, the other end, in the axial direction, of the guide tube 26 protrudes from one surface of the rotation piece 24 that is opposite the mounted depression 15.

A tube hole 26a of the guide tube 26 is tapered. Therefore, the closer to a front end (the other end) in the axial direction, the smaller an outer diameter of the tube hole 26a continuously becomes. The guide member 21 guides the C-ring 105 inserted in the tube hole 26a of the guide tube 26 toward a sample attachment portion 101 of the cartridge 100 that will be described below.

The flange 27 protrudes radially outward from one end, in the axial direction, of an outer curved surface of the guide tube 26. When the guide tube 26 is inserted in the through hole 24a, the flange 27 is mounted on the other surface of the rotation piece 24. The other surface of the rotation piece 24 is on an opposite side to the one surface of the rotation piece 24 that is opposite the mounted depression 15. The flange 27 is fixed to the other surface of the rotation piece 24 with, for example, fixing screws. Consequently, the guide member 21 is fixed to the supporting member 22.

As described above, the diameter of the through hole 24a is larger than the outer diameter of the guide tube 26. Therefore, after the guide tube 26 is inserted in the through hole 24a, a position of the guide member 21 can be adjusted relative to the supporting member 22.

The guide holding portion 14 is rotatably supported on the operation surface 11a through a rotation shaft 14a. If the guide holding portion 14 rotates, the guide holding portion 14 is moved to over the rotation piece 24 of the supporting member 22. Consequently, the guide holding portion 14 does not allow the guide member 21 and the supporting member 22 to rotate during the operation.

Further, the mounted depression 15 has a pressure release depression 16. The pressure release depression 16 is a depression in the mounted depression 15. The pressure release depression 16 is depressed toward the other side of the third direction Z. Further, the pressure release depression 16 extends from one end of the mounted depression 15 to the other end of the mounted depression 15 in the first direction X. A length of the pressure release depression 16 in the first direction X is longer than a length of the cartridge 100 in the first direction X. Further, a length of the pressure release depression 16 in the second direction Y is shorter than lengths of the mounted depression 15 and the cartridge 100 in the second direction Y.

Further, when the cartridge 100 is mounted on the mounted depression 15, the pressure release depression 16 is on the other side of the third direction Z of the cartridge 100. When the sample S1 is set, the liquid nitrogen M1 (see FIG. 1) and air bubbles Q1 that are between the cartridge 100 and the mounted depression 15 flow into the pressure release depression 16. Consequently, when the sample S1 is set, pressure from the liquid nitrogen M1 is not applied to the sample S1.

The pressure release depression 16 has an opposite portion 16a that is opposite the tube hole 26a of the guide tube 26. The opposite portion 16a has a length in the third direction Z, that is to say a depth. The length in the third direction Z is shorter than a depth of both ends 16b, in the first direction X, of the pressure release depression 16. The pressure release depression 16 has a shallowest depth at the opposite portion 16a. That is to say, the pressure release depression 16 slopes. Consequently, the pressure release depression 16 continuously becomes deeper from the opposite portion 16a toward both the ends 16b. The opposite portion 16a of the pressure release depression 16 has a volume that is smaller than a volume of each of both the ends 16b.

Cartridge

Next, a configuration of the cartridge 100 contained in the sample attachment device 1 described above will be described with reference to FIGS. 5 to 8.

Figure 5:
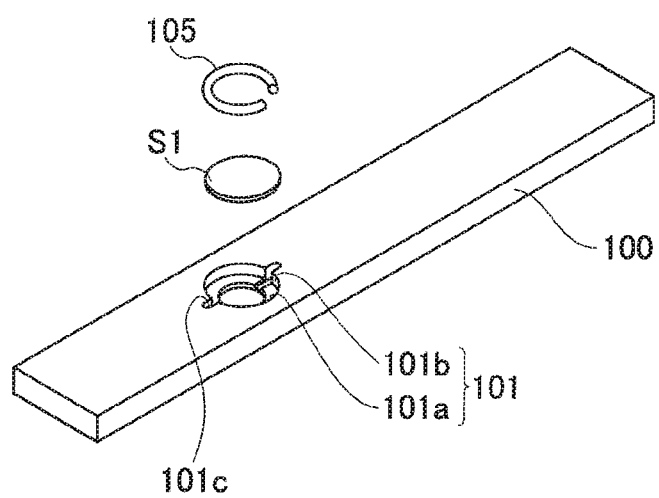
FIG. 5 is a perspective view illustrating a cartridge.
Figure 6:
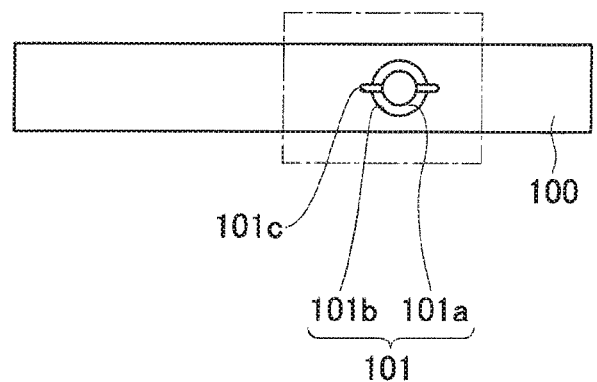
FIG. 6 is a top view illustrating the cartridge.
Figure 7:
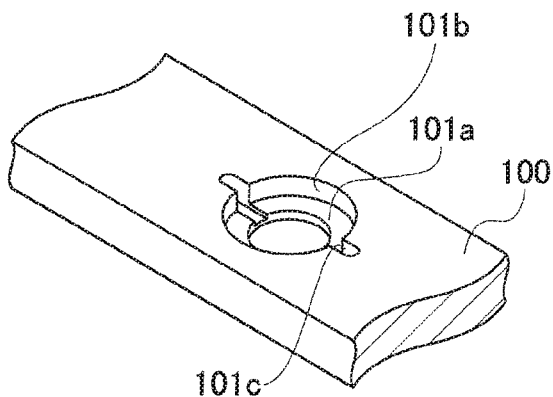
FIG. 7 is an enlarged top view illustrating a sample attachment portion of the cartridge.
Figure 8:
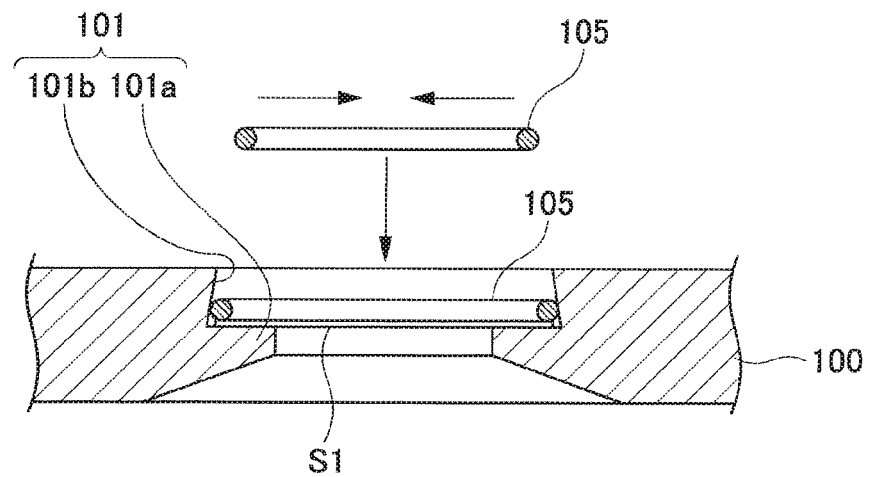
FIG. 8 is a cross-section view illustrating the sample attachment portion of the cartridge.

FIG. 5 is a perspective view illustrating the cartridge 100 and the sample S1. FIG. 6 is a top view illustrating the cartridge 100. FIG. 7 is an enlarged top view illustrating the sample attachment portion 101 of the cartridge 100. FIG. 8 is a cross-section view illustrating the sample attachment portion 101 of the cartridge 100.

As illustrated in FIGS. 5 and 6, the cartridge 100 is rectangular and substantially has a shape like a flat plate. The cartridge 100 has the sample attachment portion 101. The sample attachment portion 101 is a through hole that has substantially circular openings.

As illustrated in FIGS. 7 and 8, the sample attachment portion 101 has a mounted portion 101a and a fitted portion 101b. The sample S1 and the C-ring 105 that illustrates an example of a holder are attached to the sample attachment portion 101. The sample attachment portion 101 has the mounted portion 101a at a middle, in an axial direction, of the sample attachment portion 101. Further, the mounted portion 101a is an inner flange that protrudes radially inward from an inner wall of the sample attachment portion 101. The sample S1 is mounted on the mounted portion 101a.

In the sample attachment portion 101, the fitted portion 101b is closer to a side from which the C-ring 105 and the sample S1 are inserted than the mounted portion 101a is. An inner diameter of the fitted portion 101b continuously becomes smaller from the mounted portion 101a to an opening of the sample attachment portion 101 on a side from which the C-ring 105 and the sample S1 are inserted. The C-ring 105 that has been inserted is fitted into between the fitted portion 101b and the mounted portion 101a.

Outer edges of the mounted portion 101a and the fitted portion 101b have two notches 101c and 101c. The two notches 101c and 101c are opposite each other. The liquid nitrogen M1 in the mounted portion 101a and the fitted portion 101b passes the two notches 101c and 101c.

The preliminary-setting jig 200 that will be described below is used to push the C-ring 105 into the tube hole 26a of the guide tube 26. Further, the C-ring pushing-out jig 300 that will be described below is used to push the C-ring 105 and the sample S1 into the sample attachment portion 101.

Preliminary-Setting Jig

Next, the preliminary-setting jig 200 will be described with reference to FIG. 9.

Figure 9:
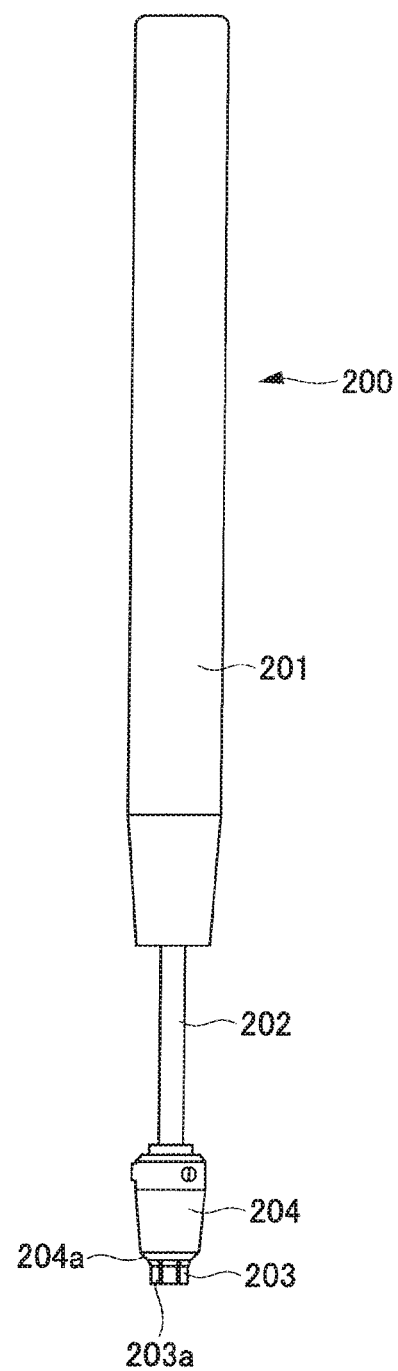
FIG. 9 is an elevation view illustrating a preliminary-setting jig of the sample attachment device according to the first exemplary embodiment of the present invention.

FIG. 9 is an elevation view illustrating the preliminary-setting jig 200.

As illustrated in FIG. 9, the preliminary-setting jig 200 includes a handle 201 held by a user, a shaft 202, a pushing-out portion 203, and a stopper 204. The shaft 202 has a shape like a rod. One end of the shaft 202 is connected with the handle 201. The pushing-out portion 203 and the stopper 204 are provided at the other end (front end), in an axial direction, of the shaft 202.

The pushing-out portion 203 is substantially cylindrical. Further, the pushing-out portion 203 has a plurality of slits 203a. The stopper 204 is on an outer curved surface of the pushing-out portion 203. A predetermined length of the pushing-out portion 203 protrudes from a front end of the stopper 204.

The front end of the stopper 204 has a tapered portion 204a. The closer to the front end in an axial direction, the smaller an outer diameter of the tapered portion 204a continuously becomes. Further, an outer diameter of the tapered portion 204a of the stopper 204 is larger than a smallest-diameter portion of the tube hole 26a of the guide tube 26.

Figure 11:
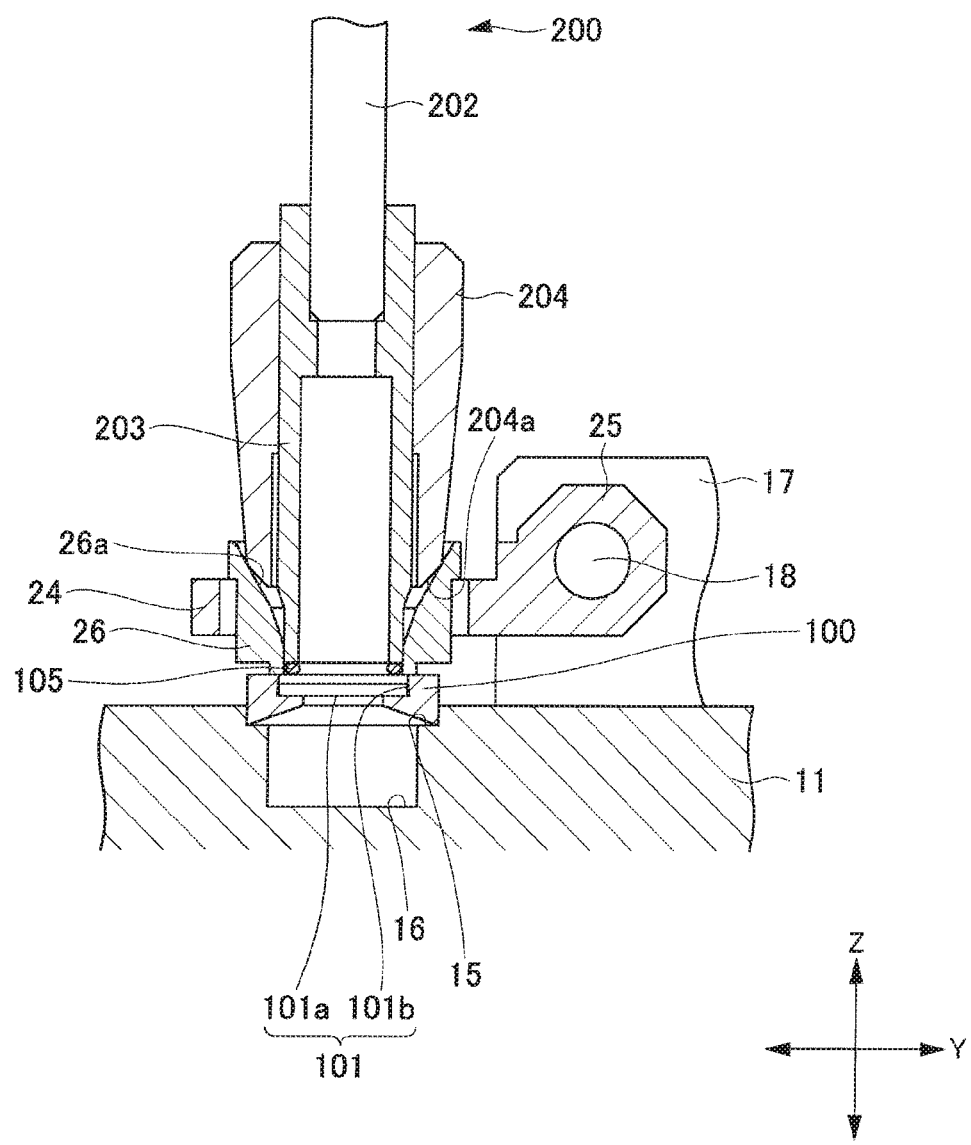
FIG. 11 is a cross-section view illustrating a C-ring that is being preliminarily set on the cartridge using the sample attachment device according to the first exemplary embodiment of the present invention.

When the pushing-out portion 203 and the stopper 204 are inserted into the tube hole 26a of the guide tube 26, the tapered portion 204a of the stopper 204 comes into contact with an inner wall surface of the tube hole 26a (see FIG. 11). Further, a length of the pushing-out portion 203 that protrudes from the stopper 204 is shorter than a length from a front end of the tapered portion 204a to a front end of the tube hole 26a when the tapered portion 204a is in contact with the tube hole 26a. The preliminary-setting jig 200 preliminarily sets the C-ring 105 in the tube hole 26a of the guide tube 26.

C-Ring Pushing-Out Jig

Next, the C-ring pushing-out jig 300 that illustrates a pushing-out jig will be described with reference to FIGS. 10A and 10B.

FIG. 10A is an elevation view illustrating the C-ring pushing-out jig 300. FIG. 10B is a cross-section view illustrating a front end of the C-ring pushing-out jig 300.

As illustrated in FIG. 10A, the C-ring pushing-out jig 300 includes a handle 301 held by a user, a shaft 302, and a pushing-out portion 303. As illustrated in FIG. 10B, the shaft 302 has a shape like a hollow tube. One end, in an axial direction, of the shaft 302 is connected with the handle 301.

The shaft 302 has a channel 305 that continues from the one end to the other end in the axial direction. Further, the shaft 302 has a plurality of holes 302a that are through an outer curved surface of the shaft 302. The holes 302a extend through the outer curved surface of the shaft 302, and communicate with the channel 305.

The pushing-out portion 303 is connected with the other end (front end), in the axial direction, of the shaft 302 The closer to the front end in an axial direction, the smaller an outer diameter of the pushing-out portion 303 continuously becomes. That is to say, the pushing-out portion 303 is tapered.

Further, a front end of the pushing-out portion 303 has a plurality of slits 303a. The slits 303a extend from the front end of the pushing-out portion 303 along the axial direction. The slits 303a have a predetermined length. Due to the plurality of slits 303a, a diameter of the front end of the pushing-out portion 303 is configured to become smaller toward a center in a radial direction.

A tube hole of the pushing-out portion 303 communicates with the channel 305 of the shaft 302 through a communication channel 306. The liquid nitrogen M1 and the air bubbles Q1 pass the communication channel 306, the channel 305, and the holes 302a.

1-2. Operation of Setting Sample Using Sample Attachment Device

Next, one example of operation of setting the sample S1 on the cartridge 100 using the above sample attachment device 1 will be described with reference to FIGS. 1, 4, 11, and 12.

Figure 12:
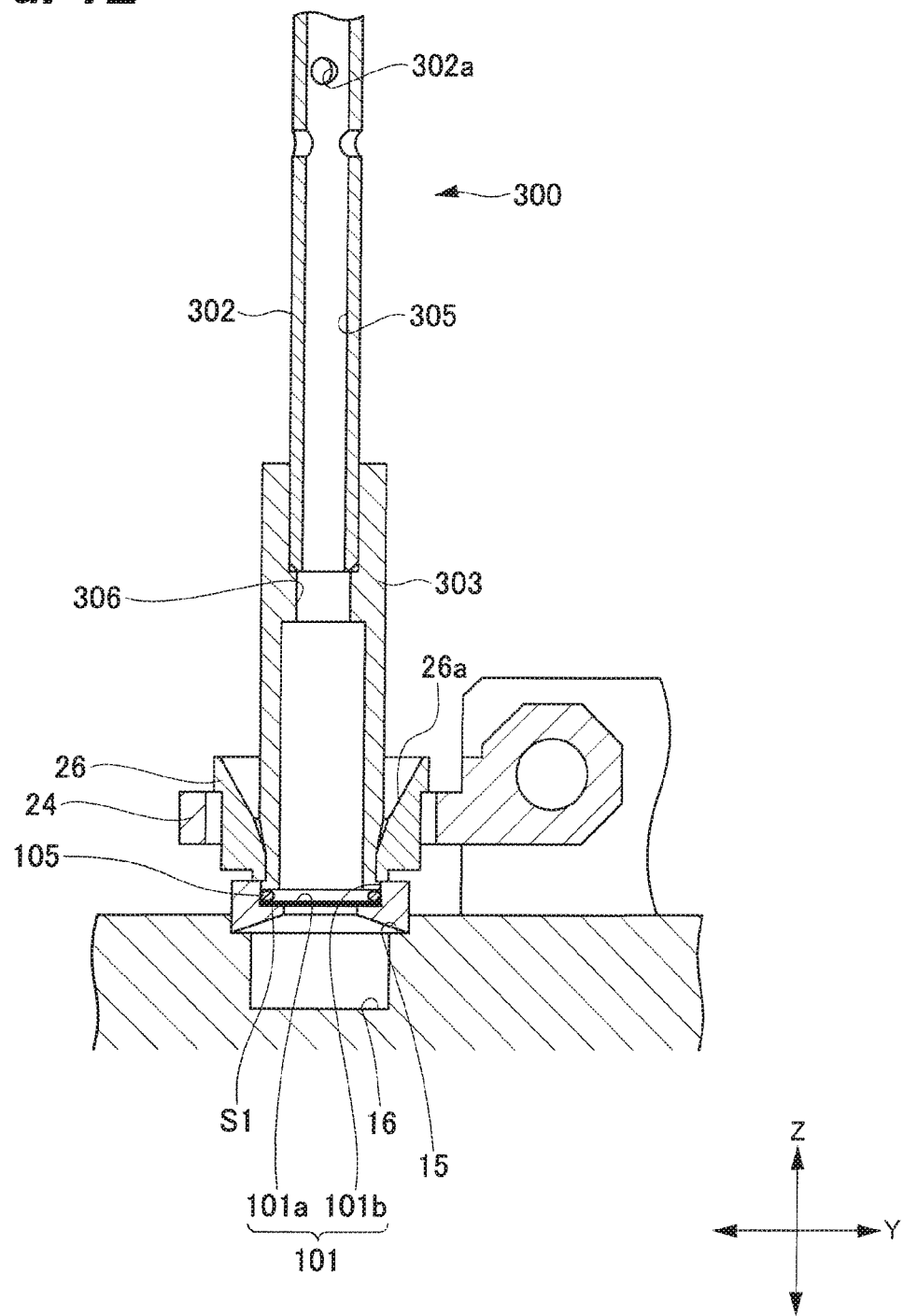
FIG. 12 is a cross-section view illustrating the C-ring and a sample that are being set on the cartridge using the sample attachment device according to the first exemplary embodiment of the present invention.

FIG. 11 is a drawing illustrating the C-ring 105 that is being preliminarily set. FIG. 12 is a drawing illustrating the sample S1 and the C-ring that are being set.

As illustrated in FIG. 1 in advance, the container 2 contains the liquid nitrogen M1, and the sample attachment unit 3 and the cartridge 100 are cooled. First, the C-ring guide member 13 is rotated to open a top portion of the mounted depression 15. Next, the cartridge 100 is mounted on the mounted depression 15.

Then, the C-ring guide member 13 is rotated to dispose the guide member 21 over the cartridge 100. Consequently, the guide tube 26 of the guide member 21 is opposite the sample attachment portion 101 of the cartridge 100. Further, as illustrated in FIG. 2, the guide holding portion 14 is rotated to dispose the guide holding portion 14 over the rotation piece 24 of the supporting member 22. Consequently, rotation of the C-ring guide member 13 is restricted. Further, the C-ring guide member 13 is less likely to be unsteady and be out of position.

Next, as illustrated in FIG. 11, the C-ring 105 is inserted into the tube hole 26a of the guide tube 26. Further, the preliminary-setting jig 200 is used to push the C-ring 105 toward the other end, in an axial direction, of the tube hole 26a. The C-ring 105 is elastically deformed by the tube hole 26a of the guide tube 26. Consequently, a diameter of the C-ring 105 becomes smaller.

Further, the tapered portion 204a of the stopper 204 of the preliminary-setting jig 200 comes into contact with the tube hole 26a of the guide tube 26. Consequently, an insertion operation of the preliminary-setting jig 200 is restricted.

As described above, a length of the pushing-out portion 203 that protrudes from the stopper 204 is shorter than a length from a front end of the tapered portion 204a to a front end of the tube hole 26a when the tapered portion 204a is in contact with the tube hole 26a. Therefore, a front end of the pushing-out portion 203 stops at the other end, in the axial direction, of the tube hole 26a. Consequently, the C-ring 105 pushed by the pushing-out portion 203 is preliminarily set at the other end (lower end), in the axial direction, of the tube hole 26a.

Next, an operator rotates the C-ring guide member 13 to open a top portion of the sample attachment portion 101 of the cartridge 100. The operator mounts the sample S1 on the mounted portion 101a of the sample attachment portion 101. Then, the C-ring guide member 13 is rotated again to make the guide tube 26 be opposite the sample attachment portion 101 of the cartridge 100.

At this time, air bubbles Q1 are generated from minute gaps and protrusions of, for example, a screw 103 of the cartridge 100. The air bubbles Q1 may make the sample S1 and the C-ring 105 float up.

Note that the air bubbles Q1 are generated from minute gaps and protrusions of, for example, the screw 103 of the cartridge 100 that will be described below. The air bubbles Q1 may make the sample S1 float up. To deal with the problem, the mounted depression 15 of the sample attachment unit 3 in the present exemplary embodiment has the pressure release depression 16 that the liquid nitrogen M1 and the air bubbles Q1 can pass. As illustrated in FIG. 4, the air bubbles Q1 that have been generated move through the pressure release depression 16.

Further, the pressure release depression 16 slopes. Consequently, the pressure release depression 16 continuously becomes deeper from the opposite portion 16a toward both the ends 16b. Therefore, the air bubbles Q1 that have been generated move from the opposite portion 16a that has a smaller volume to both the ends 16b that each have a larger volume through the pressure release depression 16.

As described above, a length of the pressure release depression 16 in the first direction X is longer than a length of the cartridge 100 in the first direction X. The air bubbles Q1 that have moved to both the ends 16b can be let out from both ends, in the first direction X, of the cartridge 100. That is to say, the air bubbles Q1 can be moved away from the opposite portion 16a that is opposite the guide tube 26. Consequently, it is possible to prevent the sample S1 from floating up due to the air bubbles Q1.

Next, as illustrated in FIG. 12, the C-ring pushing-out jig 300 is used to push the C-ring 105 into the sample attachment portion 101. Note that the C-ring 105 that has been preliminarily set at the other end of the tube hole 26a is elastically deformed and has a force in a direction that allows the diameter to be expanded. Therefore, while the C-ring 105 is pushed into, the C-ring 105 is substantially parallel to a front-end surface of the pushing-out portion 303 of the C-ring pushing-out jig 300.

If the C-ring 105 is further pushed into, the C-ring 105 is moved from the tube hole 26a of the guide tube 26 to the fitted portion 101b of the sample attachment portion 101. Further, the closer to the mounted portion 101a from an insertion-side opening, the larger an inner diameter of the fitted portion 101b. Therefore, a diameter of the C-ring 105 expands along an inner wall of the fitted portion 101b. Therefore, the C-ring 105 is fitted to the fitted portion 101b. The sample S1 is fixed to the sample attachment portion 101 since an edge of the sample S1 is held between the c-ring 105 and the mounted portion 101a. Consequently, the operation of setting the sample S1 is completed.

At this time, the tapered portion of the pushing-out portion 303 of the C-ring pushing-out jig 300 comes into contact with the tube hole 26a of the guide tube 26. The guide tube 26 does not allow the C-ring pushing-out jig 300 to move toward the cartridge 100. Consequently, it is possible to prevent the sample S1 set at the sample attachment portion 101 from being touched by the C-ring pushing-out jig 300, and being damaged.

Further, the preliminary-setting jig 200 is used to preliminarily set the C-ring 105 at the other end, in the axial direction, of the tube hole 26a that is near the sample attachment portion 101. A movement distance of the C-ring 105 from the other end, in the axial direction, of the tube hole 26a to the sample attachment portion 101 is shorter than a movement distance of the C-ring 105 from one end, in the axial direction, of the tube hole 26a to the sample attachment portion 101. Consequently, an impact generated when the C-ring 105 moves from the tube hole 26a to the fitted portion 101b of the sample attachment portion 101 can be decreased. Consequently, it is possible to prevent the sample S1 from being damaged by the impact generated when the C-ring 105 moves.

Further, the liquid nitrogen M1 that is at the mounted portion 101a and the fitted portion 101b leaves the mounted portion 101a and the fitted portion 101b through the notches 101c. Consequently, a pressure applied to the sample S1 from the liquid nitrogen M1 generated when the sample S1 is set can be decreased.

Further, when the sample S1 is set, the liquid nitrogen M1 and the air bubbles Q1 that are between the cartridge 100 and the mounted depression 15 flow into the pressure release depression 16. Consequently, when the sample S1 is set, a pressure applied to the sample S1 from the liquid nitrogen M1 and the air bubbles Q1 can be decreased, and the sample S1 can be prevented from being damaged by the pressure.

Further, when the C-ring pushing-out jig 300 is used to push the C-ring 105, the liquid nitrogen M1 that exists between the pushing-out portion 303 and the sample S1 and air bubbles Q1 that have been generated move to the channel 305 of the shaft 302 through the tube hole of the pushing-out portion 303 and the communication channel 306. Then the air bubbles Q1 move outside from the channel 305. Consequently, a pressure applied to the sample S1 from the liquid nitrogen M1 that exists between the pushing-out portion 303 and the sample S1 and the air bubbles Q1 that have been generated can be decreased. Consequently, it is possible to prevent the sample S1 from being damaged by the pressure.

2. Second Exemplary Embodiment

Next, a sample attachment device according to a second exemplary embodiment will be described with reference to FIGS. 13 and 14.

Figure 13:
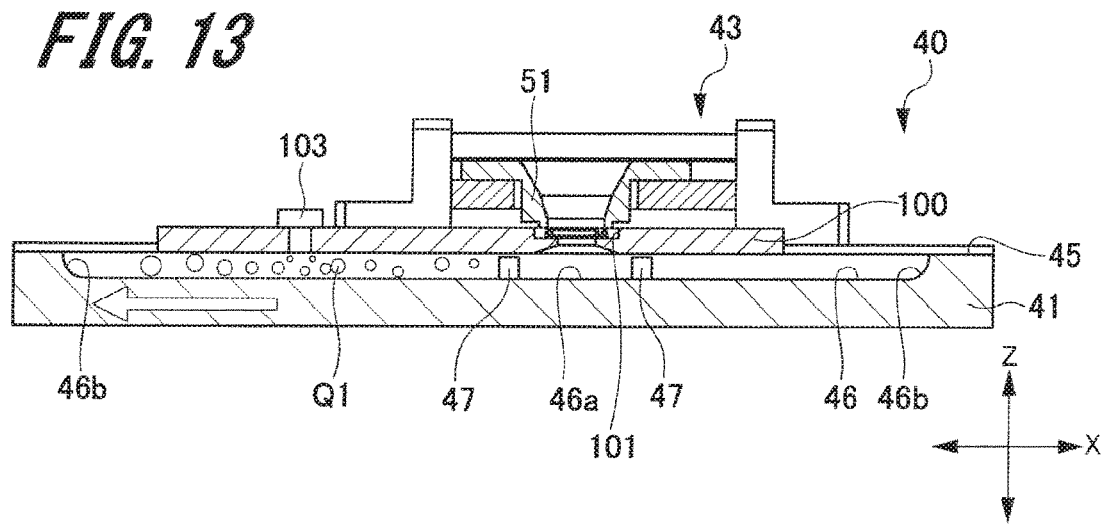
FIG. 13 is a cross-section view illustrating a sample attachment unit of a sample attachment device according to a second exemplary embodiment of the present invention.

FIG. 13 is a cross-section view illustrating a sample attachment unit of the sample attachment device according to the second exemplary embodiment.

A configuration of the sample attachment unit is a difference between the sample attachment device according to the second exemplary embodiment and the sample attachment device 1 according to the first exemplary embodiment. Therefore, the sample attachment unit will be described here. Portions that are similar to the sample attachment device 1 according to the first exemplary embodiment will be marked with the same reference numerals and will not be described again.

As illustrated in FIG. 13, a sample attachment unit 40 includes a mount 41 and a C-ring guide member 43. The mount 41 has a mounted depression 45 and a pressure release depression 46. Configurations of the C-ring guide member 43 and the mounted depression 45 are similar to the configurations of the C-ring guide member 13 and the mounted depression 15 according to the first exemplary embodiment, and thus will not be described.

The pressure release depression 46 is a depression in the mounted depression 45. The pressure release depression 46 is depressed toward the other side of a third direction Z. The pressure release depression 46 according to the second exemplary embodiment has an opposite portion 46a and both ends 46b. The opposite portion 46a and both the ends 46b have the same depth.

The pressure release depression 46 also has air-bubble restriction protrusions 47. The air-bubble restriction protrusions 47 protrude from a bottom surface of the pressure release depression 46 toward one side of the third direction Z. The air-bubble restriction protrusions 47 are at the opposite portion 46a of the pressure release depression 46. The opposite portion 46a is opposite a guide tube 51. Further, the air-bubble restriction protrusions 47 are arranged on both sides of a first direction X of the opposite portion 46a.

The air-bubble restriction protrusions 47 restrict movement of air bubbles Q1 to the opposite portion 46a through the pressure release depression 46. The air bubbles Q1 are from minute gaps and protrusions of, for example, a screw 103 of a cartridge 100. Consequently, it is possible to prevent the sample S1 from floating up due to the air bubbles Q1.

Figure 14:
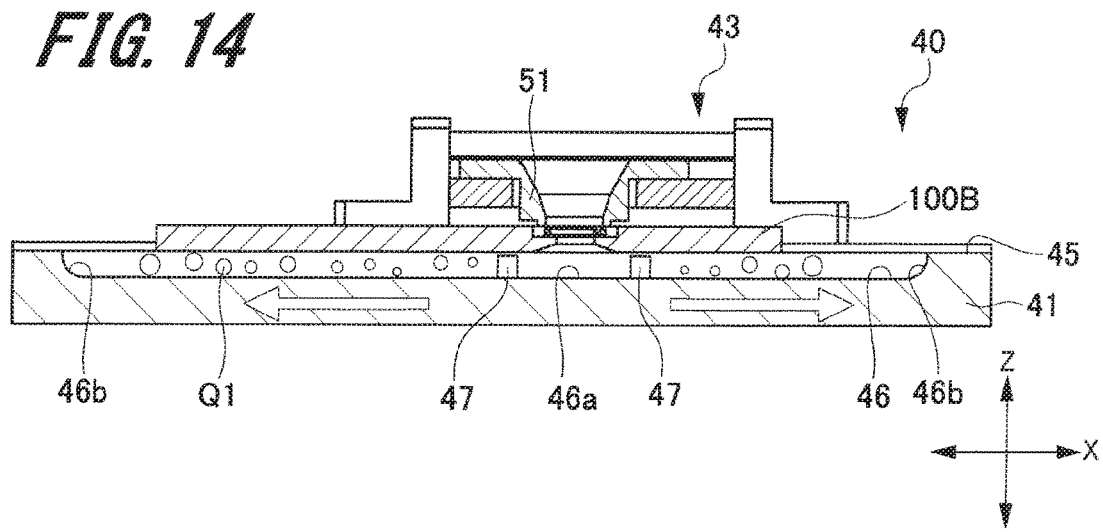
FIG. 14 is a cross-section view illustrating the sample attachment unit of the sample attachment device according to the second exemplary embodiment of the present invention.

FIG. 14 is a cross-section view illustrating a cartridge 100B that does not include a screw 103 and is mounted on the sample attachment unit 40.

As illustrated in FIG. 14, even if the cartridge 100B does not include the screw 103, the air-bubble restriction protrusions 47 do not allow air bubbles Q1 to flow to the opposite portion 46a. Consequently, it is possible to prevent the sample S1 from floating up due to the air bubbles Q1.

Other configurations are similar to the configuration of the sample attachment unit 3 according to the above first exemplary embodiment, and thus will not be described. The sample attachment unit 40 that has such a configuration can obtain actions and effects that are similar to actions and effects of the sample attachment unit 3 according to the above first exemplary embodiment.

Note that although the air-bubble restriction protrusions 47 are arranged on both sides of the first direction X of the opposite portion 46a in the described example, the arrangement is not limited to the example. The air-bubble restriction protrusion 47 may be disposed on only one side on which a member that generates air bubbles Q1 is. The member that generates air bubbles Q1 includes, for example, a protrusion or a gap of the cartridge 100 or 100B.

3. Third Exemplary Embodiment

Figure 15:
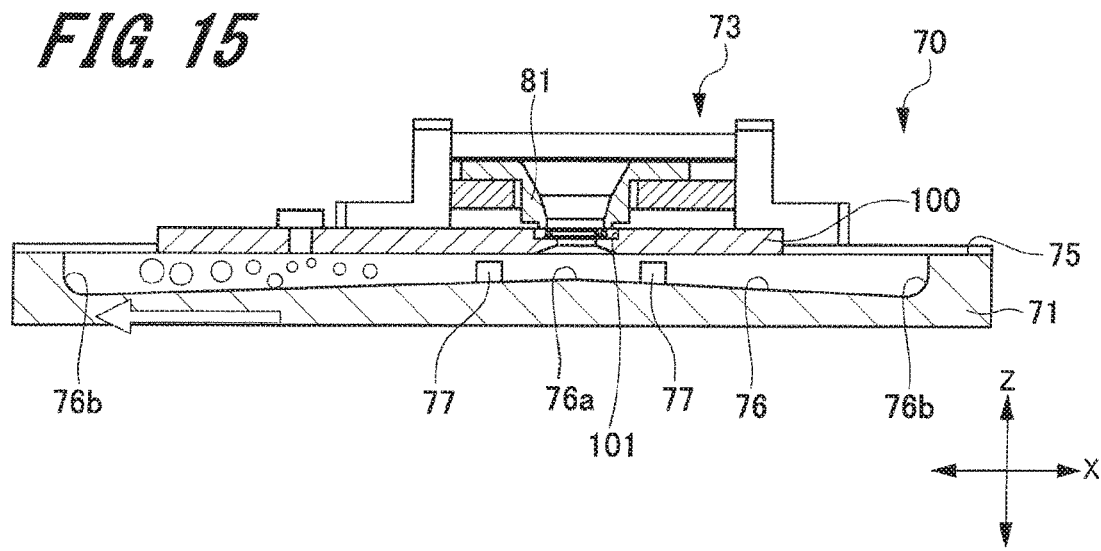
FIG. 15 is a cross-section view illustrating a sample attachment unit of a sample attachment device according to a third exemplary embodiment of the present invention.

Next, a sample attachment device according to a third exemplary embodiment will be described with reference to FIG. 15. FIG. 15 is a cross-section view illustrating a sample attachment unit of the sample attachment device according to the third exemplary embodiment.

In the sample attachment device according to the third exemplary embodiment, the configuration of the sample attachment unit 3 according to the first exemplary embodiment is combined with the configuration of the sample attachment unit 40 according to the second exemplary embodiment. Therefore, the sample attachment unit will be described here. Portions that are similar to the sample attachment device 1 according to the first exemplary embodiment will be marked with the same reference numerals and will not be described again.

As illustrated in FIG. 15, a sample attachment unit 70 includes a mount 71 and a C-ring guide member 73. The mount 71 has a mounted depression 75 and a pressure release depression 76. Configurations of the C-ring guide member 73 and the mounted depression 75 are similar to the configurations of the C-ring guide member 13 and the mounted depression 15 according to the first exemplary embodiment, and thus will not be described.

The pressure release depression 76 is a depression in the mounted depression 75. The pressure release depression 76 is depressed toward the other side of a third direction Z. The pressure release depression 76 has a shallowest depth at an opposite portion 76a that is opposite a guide tube 81 of the C-ring guide member 73. A depth of the pressure release depression 76 continuously becomes deeper from the opposite portion 76a to both ends 76b in a first direction X.

The pressure release depression 76 also has air-bubble restriction protrusions 77. The air-bubble restriction protrusions 77 protrude from a bottom surface of the pressure release depression 76 toward one side of the third direction Z. The air-bubble restriction protrusions 77 are arranged at the opposite portion 76a. Further, the air-bubble restriction protrusions 77 are arranged on both sides of the first direction X of the opposite portion 76a.

Other configurations are similar to the configuration of the sample attachment unit 3 according to the above first exemplary embodiment, and are similar to the configuration of the sample attachment unit 40 according to the above second exemplary embodiment, and thus will not be described. The sample attachment unit 70 that has such a configuration can obtain actions and effects that are similar to actions and effects of the sample attachment unit 3 according to the above first exemplary embodiment, and the sample attachment unit 40 according to the above second exemplary embodiment.

Note that the present invention is not limited to the exemplary embodiments that have been described above and are illustrated in the drawings. The present invention may be variously implemented within the scope of the gist of the invention disclosed in the claims.

Words, such as "parallel" and "perpendicular", are used in the present description. However, the words not only strictly mean "parallel" and "perpendicular" but also may mean "substantially parallel" and "substantially perpendicular" as long as the function is performed, in addition to "parallel" and "perpendicular".

What is claimed is:

1. A sample attachment device for attaching a sample to a cartridge through a holder, the sample attachment device comprising:
    a mount contained in a liquid;
    a mounted depression that is on the mount, and on which the cartridge is mounted; and
    a pressure release depression that is in the mounted depression, and is vertically under the cartridge when the cartridge is mounted on the mounted depression,
    wherein the pressure release depression allows for passing of liquid and air bubbles.

2. The sample attachment device according to claim 1, further comprising
    a guide member that is provided for the mount, and is configured to guide the holder toward a sample attachment portion of the cartridge, wherein
    the guide member has a guide tube, the guide tube has a tube hole, the tube hole is opposite the mounted depression and the pressure release depression, and the holder is configured to be inserted in the tube hole.

3. The sample attachment device according to claim 1, wherein
    the mounted depression extends longer than a length of the cartridge in a long-side direction.

4. The sample attachment device according to claim 2, wherein
    the pressure release depression has a vertically shallowest depth at an opposite portion that is opposite the guide tube, and a depth of the pressure release depression becomes deeper from the opposite portion to an end.

5. The sample attachment device according to claim 4, wherein
    an air-bubble restriction protrusion is at the opposite portion of the pressure release depression, the opposite portion is opposite the guide tube, and the air-bubble restriction protrusion is configured to restrict movement of the air bubbles to the opposite portion.

6. The sample attachment device according to claim 2, wherein
    a guide holding portion is provided for the mount, and the guide holding portion is configured to hold the guide member.

7. The sample attachment device according to claim 2, further comprising
    a pushing-out jig configured to push the holder disposed in the tube hole toward the sample attachment portion, wherein,
    the pushing-out jig includes:
    a shaft that is tubular and has a channel that the liquid and the air bubbles are passable; and
    a pushing-out portion that is tubular, is connected with a front end of the shaft, and is configured to be in contact with the holder,
    the shaft has a hole, the hole communicates with the channel, and the liquid and the air bubbles are capable of passing the hole, and
    a tube hole of the pushing-out portion communicates with the channel of the shaft through a communication channel.

8. The sample attachment device according to claim 7, further comprising
    a preliminary-setting jig configured to push the holder disposed in the tube hole to a vertically lower end of the tube hole to preliminarily set the holder at the vertically lower end of the tube hole, wherein
    the preliminary-setting jig includes:
    a pushing-out portion configured to be in contact with the holder; and
    a stopper that is provided for the pushing-out portion and is configured to be in contact with an inner wall surface of the tube hole, and
    the pushing-out jig is configured to push the holder that has been preliminarily set by the preliminary-setting jig to the sample attachment portion.

* * * * *